United States Patent
Wang et al.

(10) Patent No.: US 11,422,212 B2
(45) Date of Patent: Aug. 23, 2022

(54) SYSTEM AND METHOD FOR WIRELESS MAGNETIC RESONANCE IMAGING (MRI) DATA TRANSMISSION

(71) Applicant: Siemens Healthcare GmbH, Erlangen (DE)

(72) Inventors: JianMin Wang, Shenzhen (CN); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/199,138

(22) Filed: Mar. 11, 2021

(65) Prior Publication Data

US 2021/0286033 A1 Sep. 16, 2021

(30) Foreign Application Priority Data

Mar. 13, 2020 (CN) .................. 20 2010 175 311.7

(51) Int. Cl.
*G01R 33/36* (2006.01)

(52) U.S. Cl.
CPC ..... *G01R 33/3692* (2013.01); *G01R 33/3607* (2013.01); *G01R 33/3621* (2013.01); *G01R 33/3628* (2013.01)

(58) Field of Classification Search
CPC ............ G01R 33/3692; G01R 33/3607; G01R 33/3621; G01R 33/3628
See application file for complete search history.

(56) References Cited

U.S. PATENT DOCUMENTS

| | | | |
|---|---|---|---|
| 2009/0066667 A1 | 3/2009 | Feher | |
| 2009/0230966 A1* | 9/2009 | Ehnholm | G01R 33/3415 324/322 |
| 2009/0286478 A1* | 11/2009 | Biber | G01R 33/3621 455/41.2 |
| 2012/0127922 A1 | 5/2012 | Feher | |
| 2012/0224617 A1 | 9/2012 | Feher | |
| 2017/0085114 A1 | 3/2017 | Gao et al. | |

(Continued)

FOREIGN PATENT DOCUMENTS

| | | |
|---|---|---|
| CN | 202799169 U | 3/2013 |
| CN | 204271761 U | 4/2015 |
| KR | 20170058763 A | 5/2017 |

*Primary Examiner* — Gregory H Curran
(74) *Attorney, Agent, or Firm* — Banner & Witcoff Ltd.

(57) ABSTRACT

A MR wireless receiving coil device may include transmitters and receivers, the number of the receivers being equal to or greater than the number of the transmitters; each transmitter comprises: a coil group, an ADC group, two baseband low-pass filters, and an IQ modulation transmitter, wherein the coil group is connected to the ADC group, the ADC group is connected to the two baseband low-pass filters, the two baseband low-pass filters are connected to the IQ modulation transmitter, and the IQ modulation transmitter is provided with an antenna; each coil group contains one or more coils, and the maximum number of coils contained in each coil group is determined by available bandwidth, modulation scheme, and the bandwidth, sampling rate, and sampling accuracy of MR signal. The device and corresponding method advantageously allows an increase in the amount of magnetic resonance information transmitted per unit frequency band.

20 Claims, 8 Drawing Sheets

(56) References Cited

U.S. PATENT DOCUMENTS

2017/0085297 A1     3/2017   Gao et al.
2018/0109411 A1*   4/2018   Sen .................... G01R 33/3607
2018/0359017 A1   12/2018   Kwon et al.

* cited by examiner

SYSTEM AND METHOD FOR WIRELESS MAGNETIC RESONANCE IMAGING (MRI) DATA TRANSMISSION

CROSS REFERENCE TO RELATED APPLICATIONS

This patent application claims priority to Chinese Patent Application No. 202010175311.7, filed Mar. 13, 2020, which is incorporated herein by reference in its entirety.

BACKGROUND

Technical Field

The present disclosure relates to the technical field of magnetic resonance imaging (MRI), and in particular to a magnetic resonance (MR) wireless receiving coil device, to a method for wirelessly receiving an MR signal, and to an MR system.

Related Art

MRI local coil arrays are widely used to improve the quality of MRI imaging. Generally, all local coil array elements are connected to an MR receiving system through cables. In order to suppress a common-mode signal on a cable and suppress the burning of a patient caused by a large current, each channel of an MR receiver needs to be provided with a radio frequency (RF) trap, and cables must be laid such that an induction current of a high-power RF pulse is minimal; in addition, such cables are cumbersome, leading to an increase in maintenance costs, difficulty of handling, and inconvenience of use.

In order to solve these problems, the concept of magnetic resonance wireless local coils has been proposed in recent years, which mainly include: 1. inductively coupled coil; 2. analog amplitude-modulation wireless coil; 3. analog frequency-modulation wireless coil; 4. digital wireless coil using the 5.8 GHz Industrial Scientific Medical (ISM) band; 5. digital wireless coil compliant with the wireless fidelity (Wi-Fi) standards 802.11ac or 802.11ad; 6. digital wireless coil using the 60 GHz band; and 7. digital wireless coil using ultra-wide band (UWB).

A digital wireless coil is able to transmit a signal without loss of image quality. Generally, a channel of MRI coil requires a bandwidth of about +/−0.4 MHz and a dynamic range of 18 bits, which results in a theoretical data rate limit of about 30 Mbit/s. For a system with a 32-channel receiver, the bandwidth data transmission rate will greatly exceed 1 G bit/s.

The above-mentioned existing magnetic resonance wireless local coil solution has the following shortcomings:
1. All existing magnetic resonance wireless induction coupling coils are single coils, and the amount of magnetic resonance information induced by such a coil is small;
2. When a digital wireless coil operating in the 5.8 GHz ISM band is adopted, the modulation scheme adopted is quadrature amplitude modulation (QAM) 256. Since the 5.8 GHz ISM band only provides 150 MHz bandwidth for data transmission, the maximum sampling rate supported is 150 Msps; when QAM 256 is used, the maximum theoretical data rate is limited to 8×150 Mbit/s=1.2 Gbit/s, and signal processing needs to be performed by a field-programmable gate array (FPGA) and a digital-to-analog converter (DAC), which makes the implementation cumbersome and holds no appeal for application in wireless coils;
3. The use of ready-made standard Wi-Fi products requires the operating system to run Wi-Fi standard protocols in real time for management, which imposes much stricter requirements for computing power, and therefore requires high power and high shielding performance;
4. The adoption of the 60 GHz band allows the use of bandwidth exceeding 1 GHz, and may allow use for data transmission at a rate higher than 1 Gbit/s. However, at a millimeter wave frequency, the free-space attenuation and absorption of a signal by clothes or the patient's body is much higher. Horn antennas are currently used to increase the directivity of wave propagation, but the transmission distance is still very limited; and
5. UWB may realize data transmission between a coil and a magnetic resonance imaging system. In order to transmit data at several Gbit/s with a limited transmission power density (−41.3 dBm/MHz), it is necessary to use 3.1 GHz to 10.6 GHz, the greater part of the UWB frequency range. Most likely, different coils will be assigned to different transmission frequencies, which is disadvantageous to the design and manufacture of coils, and will also increase the complexity of the system. According to regulatory requirements, the limit on the total power of UWB is very strict, which makes it difficult to realize wireless coils.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
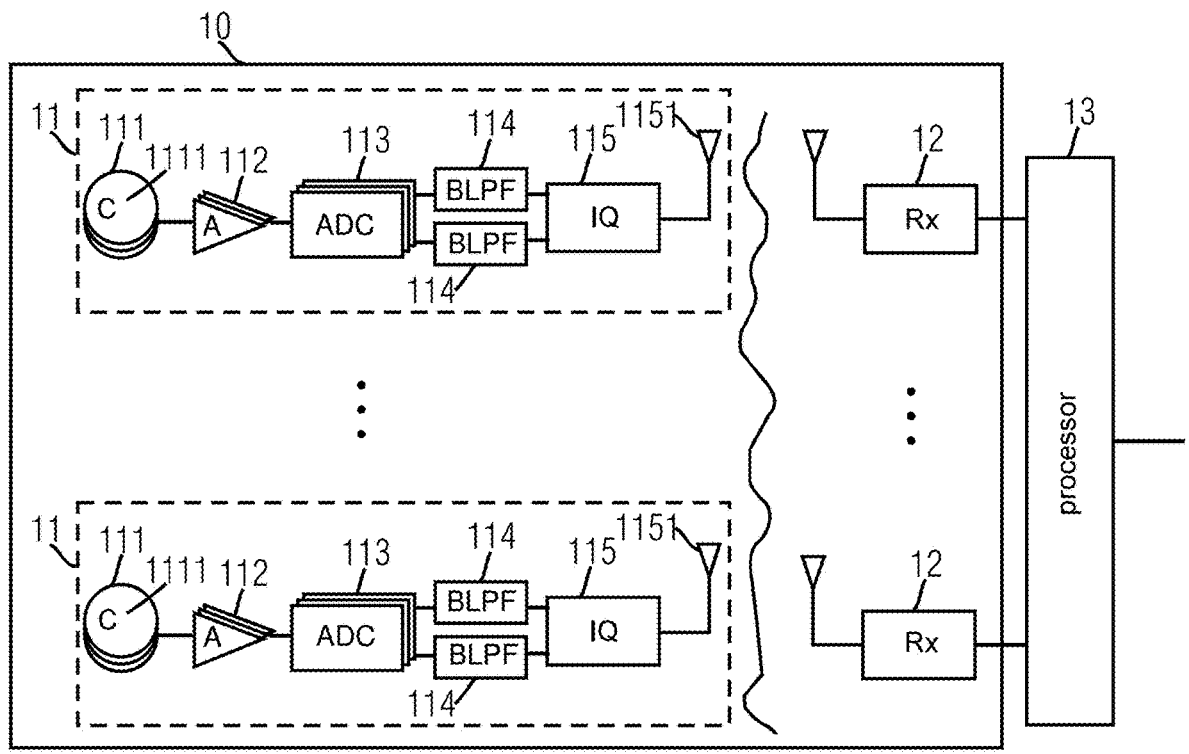
FIG. 1 is a schematic structural diagram for an MR wireless receiving coil device according to an embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to provide an MR wireless receiving coil device to increase the amount of magnetic resonance information transmitted per unit frequency band.

The present disclosure provides a method for wirelessly receiving an MR signal to reduce the implementation complexity of MR signal reception.

The present disclosure provides an MR system to reduce the implementation complexity of MR signal reception.

According to an exemplary embodiment, a technical solution provided by the present disclosure is achieved as follows:

an MR receiving coil device, located in a magnetic resonance system, the device comprising: a plurality of transmitters and a plurality of receivers, the number of the receivers being equal to or greater than the number of the transmitters;

each transmitter comprises: a coil group, an analog-to-digital converter (ADC) group, two baseband low-pass filters, and an IQ modulation transmitter, wherein the coil group is connected to the ADC group, the ADC group is connected to the two baseband low-pass filters, the two baseband low-pass filters are connected to the IQ modulation transmitter, and the IQ modulation transmitter is provided with an antenna;

each coil group contains one or more coils, and the maximum number of coils contained in each coil group is determined by available bandwidth, modulation scheme, as well as the bandwidth, sampling rate, and sampling accuracy of MR signal; the number of ADCs contained in each ADC group is equal to or smaller than the number of coils contained in each coil group;

the coil group in each transmitter, on receiving an MR signal, outputs the MR signal to the connected ADC group, the ADC group converts the input MR signal from an analog signal to a digital signal, and then outputs the signal through two channels to the two connected baseband low-pass filters, respectively; the two baseband low-pass filters perform low-pass filtering on the input digital signal to limit the frequency band of the signal to be within a bandwidth supported by the used frequency band, and output the two signals obtained after low-pass filtering as signals I and Q, respectively, to the IQ modulation transmitter; the IQ modulation transmitter, by a quadrature amplitude modulation (QAM) scheme, modulates the input signals I and Q to the frequency of the used frequency band and then transmits the modulated signal through the antenna;

each receiver, on receiving a signal from each IQ modulation transmitter, demodulates the signal with a demodulation scheme corresponding to the QAM modulation scheme to restore it to baseband signals I and Q, converts the baseband signals I and Q from analog signals to digital signals, and outputs the converted digital signals to a signal processor for processing, or, on receiving a signal from each IQ modulation transmitter, lowers the frequency of the signal, converts the signal from an analog signal to an intermediate-frequency digital signal, demodulates baseband signals I and Q from the intermediate-frequency digital signal, and then outputs the digital baseband signals I and Q to the signal processor for processing.

In an exemplary embodiment, the coil group in each transmitter is connected to the ADC group through an amplifier group, the coil group in each transmitter, on receiving an MR signal, outputs the MR signal to the connected amplifier group, and the amplifier group, after amplifying the input MR signal, outputs the amplified MR signal to the connected ADC group.

In an exemplary embodiment, the coil is connected in series with a detuning control circuit and a tuning circuit, a low-noise amplifier group and a mixer group are connected between a coil group and an amplifier group of the transmitter, the tuning circuit of each coil in the coil group is respectively connected to a low-noise amplifier in the low-noise amplifier group, each low-noise amplifier in the low-noise amplifier group is respectively connected to a mixer in the mixer group, and each mixer in the mixer group is respectively connected to an amplifier in the amplifier group.

In an exemplary embodiment, the low-noise amplifier group performs low-noise amplification on an MR signal output by the coil group, and then outputs the MR signal subjected to low-noise amplification to the mixer group.

In an exemplary embodiment, the mixer group mixes the MR signal output by the low-noise amplifier group, moves the frequency of the MR signal to another preset frequency, and outputs the mixed MR signal to the amplifier group.

In an exemplary embodiment, the tuning circuit is connected to the corresponding low-noise amplifier in the low-noise amplifier group in the transmitter through a coaxial cable or wire, the low-noise amplifier group is connected to the mixer group in the transmitter through a coaxial cable or a wire, and the mixer group is connected to the amplifier group in the transmitter through a coaxial cable or a wire.

In an exemplary embodiment, the transmitter further comprises: a digital signal processor, the digital signal processor being connected between an ADC group and the two baseband low-pass filters or built in an ADC group.

In an exemplary embodiment, the digital signal processor is configured to filter and mix a digital signal obtained by the ADC group through AD conversion, move the frequency of the digital signal to a preset low frequency, lower the sampling rate of the digital signal, perform forward error correction on the digital signal by using convolutional code, and output the digital signal subjected to forward error correction through two channels to the two connected baseband low-pass filters, respectively.

In an exemplary embodiment, the IQ modulation transmitter adopts QAM 16, QAM 64, or QAM 256 to modulate the center frequency of an input signal to the frequency of the used frequency band.

In an exemplary embodiment, the digital signal processor is connected to two baseband low-pass filters through two DACs, the two DACs being configured to respectively convert two digital signals output by the digital signal processor into analog signals and then output the signals to the two baseband low-pass filters.

In an exemplary embodiment, the coil group in each transmitter is connected to the ADC group in the transmitter through a coaxial cable or wire, the ADC group in each transmitter is connected to the two baseband low-pass filters in the transmitter through a coaxial cable or a wire; and the two baseband low-pass filters in each transmitter are connected to the IQ modulation transmitter in the transmitter through a coaxial cable or a wire.

In an exemplary embodiment, each receiver comprises: a receiving demodulator and two ADCs, where the receiving demodulator is connected to the two ADCs, and the receiving demodulator is provided with an antenna.

The receiving demodulator in each receiver, on receiving a signal from each IQ modulation transmitter through the antenna, may demodulate the signal by a demodulation scheme corresponding to the QAM modulation scheme to restore it to baseband signals I and Q; after low-pass filtering is performed on the baseband signals I and Q, the baseband signals I and Q are output to the two connected ADCs, respectively; the two ADCs may convert the input baseband signal I or signal Q from an analog signal to a digital signal, and output the digital signal obtained after the conversion to the signal processor for processing.

In an exemplary embodiment, alternatively, each receiver comprises: a receiving demodulator, two low-pass filters, and two ADCs, wherein the receiving demodulator is connected to the two low-pass filters, each low-pass filter being connected to one ADC, respectively, and the receiving demodulator is provided with an antenna. The receiving demodulator in each receiver, on receiving a signal from each IQ modulation transmitter through the antenna, demodulates the signal by using a demodulation scheme corresponding to the QAM modulation scheme to restore it to baseband signals I and Q, outputs the baseband signals I and Q respectively to a low-pass filter for low-pass filtering; the two low-pass filters output the baseband signals I and Q subjected to low-pass filtering to their respective connected ADCs; the two ADCs convert the input baseband signal I or signal Q from an analog signal to a digital signal, and output the digital signal obtained after the conversion to the signal processor for processing.

The receiving demodulator in each receiver is connected to the two ADCs in the receiver through a coaxial cable or a wire;
alternatively, the receiving demodulator in each receiver is connected to the two low-pass filters in the receiver through a coaxial cable or wire, each low-pass filter being respectively connected to an ADC through a coaxial cable or wire.

In an exemplary embodiment, each receiver may include: a down-conversion mixer, an ADC, and an IQ digital demodulator, wherein the down-conversion mixer is connected to the ADC, the ADC is connected to the IQ digital demodulator, and the down-conversion mixer is provided with an antenna. The down-conversion mixer in each receiver, on receiving a signal from each IQ modulation transmitter through the antenna, reduces the frequency of the signal to the frequency accepted by the ADC and then outputs the signal with lowered frequency to the ADC; the ADC converts the input signal from an analog signal to an intermediate-frequency digital signal, and then outputs the intermediate-frequency digital signal to the IQ digital demodulator; the IQ digital demodulator, by using a demodulation scheme corresponding to the QAM modulation scheme, demodulates baseband signals I and Q from the input intermediate-frequency digital signal, and then outputs the digital baseband signals I and Q to the signal processor for processing.

The down-conversion mixer may be connected to an ADC in the receiver through a coaxial cable or a wire, the ADC, and the IQ digital demodulator connected to the receiver through a coaxial cable or a wire.

In an exemplary embodiment, a method for receiving an MR signal, which is applicable in the MR receiving coil device as described above, includes:
receiving, with a coil group in a transmitter, an MR signal and then outputting the MR signal to the connected ADC group; converting, with the ADC group, the input MR signal from an analog signal to a digital signal, and then outputting the signal through two channels to the two connected baseband low-pass filters, respectively; performing, with the two baseband low-pass filters respectively, low-pass filtering on the input digital signal, limiting the frequency band of the digital signal to be within the bandwidth supported by the used frequency band, and outputting the signals obtained after the low-pass filtering as signals I and Q, respectively, to the IQ modulation transmitter; and adopting, with the IQ modulation transmitter, a quadrature amplitude modulation (QAM) scheme to modulate the input signals I and Q to the frequency of the used frequency band, and transmitting the modulated signal through the antenna. In an exemplary embodiment, each receiver, on receiving a signal from each IQ modulation transmitter, demodulates the signal with a demodulation scheme corresponding to the QAM modulation scheme to restore it to baseband signals I and Q, performs low-pass filtering on the baseband signals I and Q, converts them from analog signals to digital signals, and outputs the converted digital signals to a signal processor for processing, or, on receiving a signal from each IQ modulation transmitter, lowers the frequency of the signal, converts the signal from an analog signal to an intermediate-frequency digital signal, demodulates baseband signals I and Q from the intermediate-frequency digital signal, and then outputs the digital baseband signals I and Q to the signal processor for processing.

In an exemplary embodiment, the adopting, with the IQ modulation transmitter, a QAM scheme to modulate the input signals I and Q to the frequency of the used frequency band includes:
adopting, with the IQ modulation transmitter, a quadrature phase shift keying (QPSK) or offset quadrature phase shift keying (OQPSK) scheme to modulate the input signals I and Q to the frequency of the used frequency band.

In an exemplary embodiment, after converting, with the ADC group, the input MR signal from an analog signal to a digital signal, the method further comprises: filtering and mixing the digital signal, moving the frequency of the digital signal to a preset low frequency, lowering the sampling rate of the digital signal, performing forward error correction on the digital signal by using convolutional code, converting the digital signal subjected to forward error correction into analog signals through two channels, and outputting the two analog signals to the two baseband low-pass filters, respectively. In an exemplary embodiment, the adopting, with the IQ modulation transmitter, a QAM scheme to modulate the input signal to the frequency of the used frequency band includes: adopting, with the IQ modulation transmitter, QAM 16, QAM 64, or QAM 256 to modulate the input signal to the frequency of the used frequency band.

In an exemplary embodiment, the limiting the frequency band of the digital signal to be within the bandwidth supported by the used frequency band includes: limiting the frequency band of the digital signal to be within the bandwidth supported by the Industrial Scientific Medical (ISM) band. The adopting, with the IQ modulation transmitter, a quadrature amplitude modulation (QAM) scheme to modulate the input signals I and Q to the frequency of the used frequency band includes: adopting, with the IQ modulation transmitter, a QAM scheme to modulate the input signals I and Q to the 5.8 GHz frequency of the ISM band.

In an exemplary embodiment, an MR system is disclosed, which may include any one of the MR receiving coil devices as described above.

In an exemplary embodiment of the present disclosure, an MR wireless receiving coil device is designed such that it is composed of a plurality of transmitters and a plurality of receivers, each transmitter containing a coil group composed of one or more coils, the plurality of transmitters simultaneously receiving signals from different coils; after signal processing, the MR signal is modulated to the carrier frequency of the same digital signal for transmission, and then a plurality of receivers are used to simultaneously receive the MR signal; this allows an increase in the amount of magnetic resonance information transmitted per unit frequency band.

As used in the description and the appended claims of the present disclosure, the singular forms "a" and "said" are also intended to include plural forms, unless expressly otherwise specified herein.

FIG. 1 is a schematic structural diagram for an MR wireless receiving coil device 10 according to an embodiment of the present disclosure. The device may be located in an MR system. The device 10 may include: a plurality of transmitters 11 and a plurality of receivers 12, the number of the receivers 12 being equal to or greater than the number of the transmitters 11. Each transmitter 11 may include: a coil group 111, an amplifier group 112, an ADC group 113, two baseband low-pass filters 114, and an IQ modulation transmitter 115. In an exemplary embodiment, the receiving coil device 10 (and/or one or more components comprised therein) includes processor circuitry that is configured to perform one or more functions and/or operations of the receiving coil device 10 (or the corresponding internal component).

In an exemplary embodiment, the coil group 111 is connected to the amplifier group 112 through a coaxial cable or wire. If the distance between the coil group 111 and the amplifier group 112 is great, for example, being greater than 2 centimeters (cm), they may be connected through a coaxial cable; otherwise, they may be connected through a wire, for example, a copper wire.

In an exemplary embodiment, the coil group 111 of each transmitter 11 contains one or more coils 1111, and the maximum number of coils 1111 contained in each coil group 111 is determined by available bandwidth, modulation scheme, as well as the bandwidth, sampling rate, and sampling accuracy of MR signal. The available bandwidth, for example, is the bandwidth of the 5.8 GHz ISM band.

In an exemplary embodiment, the number of amplifiers included in each amplifier group 112 is the same as the number of coils 1111 included in each coil group 111.

In an exemplary embodiment, the amplifier group 112 is connected to the ADC group 113 through a coaxial cable or wire. If the distance between the amplifier group 112 and the ADC group 113 is great, for example, being greater than 2 cm, they may be connected through a coaxial cable; otherwise, they may be connected through a wire, for example, a copper wire.

In an exemplary embodiment, the number of ADCs included in the ADC group 113 is equal to or smaller than the number of amplifiers included in the amplifier group 112.

In an exemplary embodiment, the ADC group 113 is connected to two baseband low-pass filters 114 through coaxial cables or wires. If the distance between the ADC group 113 and a baseband low-pass filter 114 is great, for example, being greater than 2 cm, they may be connected through a coaxial cable; otherwise, they may be connected through a wire, for example, a copper wire.

In an exemplary embodiment, the two baseband low-pass filters 114 are connected to the IQ modulation transmitter 115 through a coaxial cable or wire, and the IQ modulation transmitter 115 is provided with an antenna 1151. The IQ modulation transmitter 115 may be provided with an internally integrated or external antenna 1151.

If the distance between a baseband low-pass filter 114 and the IQ modulation transmitter 115 is great, for example, being greater than 2 cm, they may be connected through a coaxial cable; otherwise, they may be connected through a wire, for example, a copper wire.

Each receiver 12 may have one of the following two structures.

Figure 2:
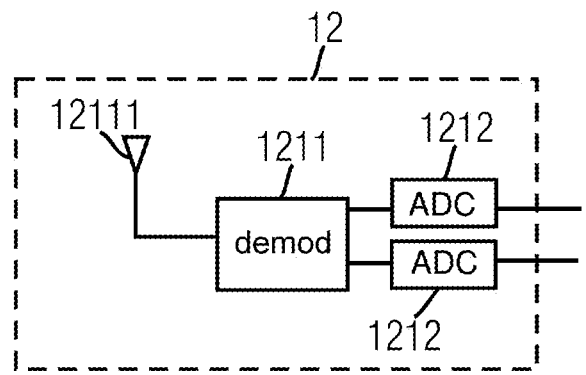
FIG. 2 is a schematic structural diagram for a receiver in an MR wireless receiving coil device according to an embodiment of the present disclosure.

The first structure is shown in FIG. 2, with the receiver 12 comprising: a receiving demodulator 1211 and two ADCs 1212.

In an exemplary embodiment, the receiving demodulator 1211 is connected to two ADCs 1212 through a coaxial cable or wire, and the receiving demodulator 1211 is provided with an antenna 12111. In an exemplary embodiment, the receiving demodulator 1211 is provided with an internally integrated or external antenna 12111.

In an exemplary embodiment, the receiving demodulator 1211 is provided with a built-in low-pass filter, or, after being connected to two external low-pass filters, is connected to the two ADCs 1212. If the distance between the receiving demodulator 1211 and an ADC 1212 is great, for example, being greater than 2 cm, they may be connected through a coaxial cable; otherwise, they may be connected through a wire, for example, a copper wire.

In an exemplary embodiment, the two ADCs 1212 are connected to a signal processor 13 through coaxial cables or wires. If the distance between an ADC 1212 and the signal processor 13 is great, for example, being greater than 2 cm, they may be connected through a coaxial cable; otherwise, they may be connected through a wire, for example, a copper wire.

Figure 3:
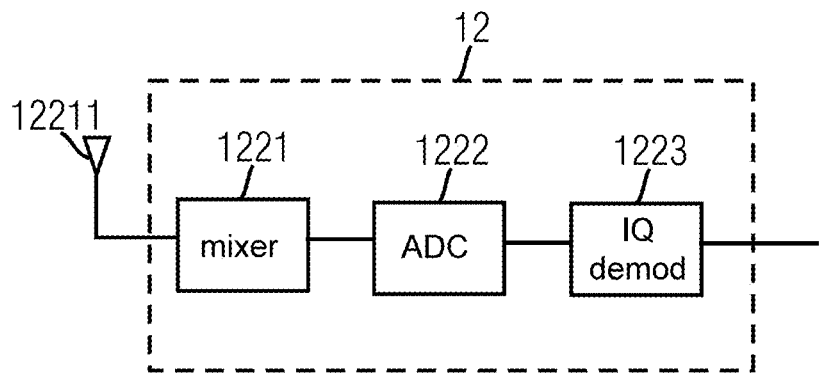
FIG. 3 is a schematic structural diagram for a receiver in an MR wireless receiving coil device according to another embodiment of the present disclosure.

The second structure is shown in FIG. 3, with the receiver 12 comprising: a down-conversion mixer 1221, an ADC 1222, and an IQ digital demodulator 1223. In an exemplary embodiment, the down-conversion mixer 1221 is connected to the ADC 1222, the ADC 1222 is connected to the IQ digital demodulator 1223, the IQ digital demodulator 1223 is connected to the signal processor 13, and the down-conversion mixer 1221 is provided with an antenna 12211.

The down-conversion mixer 1221 may be provided with an internally integrated or external antenna 12211.

Figure 4:
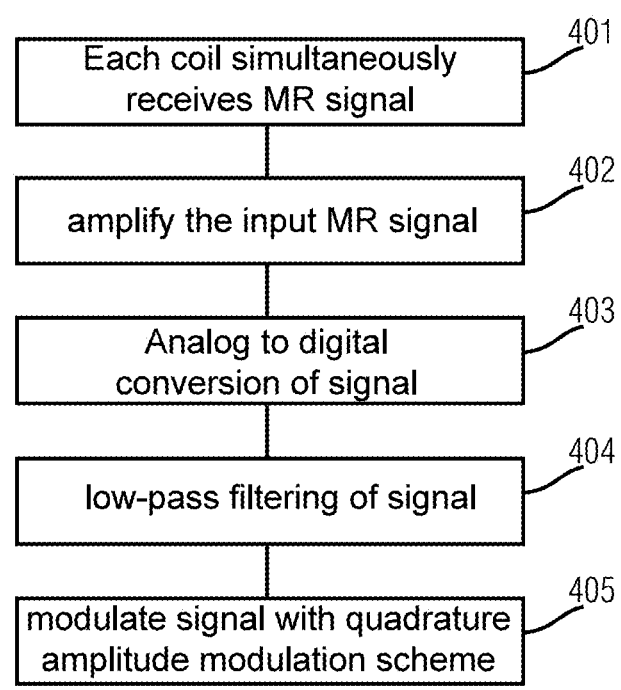
FIG. 4 is a flowchart for a transmission processing method in the process of wirelessly receiving an MR signal by using a transmitter in the MR wireless receiving coil device shown in FIG. 1 according to an embodiment of the present disclosure.

FIG. 4 is a flowchart for a transmission processing method in the process of wirelessly receiving an MR signal by using a transmitter in the MR receiving coil device shown in FIG. 1 according to an embodiment of the present disclosure, and the specific steps are as follows:

Step 401: Each coil 1111 in a plurality of coil groups 111 in each transmitter 11 simultaneously receives an MR signal; Each coil 1111 in the coil group 111 in each transmitter 11 receives the MR signal, and outputs the MR signal to the corresponding amplifier in the connected amplifier group 112.

Step 402: Each amplifier in the amplifier group 112 amplifies the input MR signal, and outputs the amplified MR signal to the corresponding ADC in the connected ADC group 113.

Step 403: Each ADC in the ADC group 113 converts the input MR signal from an analog signal to a digital signal, and outputs the converted digital signal through two channels to the two connected baseband low-pass filters 114, respectively.

Step 404: Each baseband low-pass filter 114 performs low-pass filtering on the input digital signal, limits the frequency band of the digital signal to be within the bandwidth (for example, ±75 MHz of the 5.8 GHz ISM band) supported by the available frequency band (for example, the 5.8 GHz ISM band), and then outputs the two signals obtained after low-pass filtering as signals I and Q, respectively, to the IQ modulation transmitter 115.

After being filtered by the baseband low-pass filters 114, the digital signal is converted into an analog signal with greater anti-interference ability.

Step 405: The IQ modulation transmitter 115 adopts a quadrature amplitude modulation (QAM) scheme to modulate the input signals I and Q to the frequency of the used frequency band (for example, the 5.8 GHz frequency of the ISM band), and transmits the modulated signal through the antenna 1151.

Preferably, in order to reduce the implementation complexity of MR signal reception, the IQ modulation transmitter 115 may modulate the input signals I and Q to the frequency of the used frequency band by adopting an IQ Quadrature Phase Shift Keying (QPSK) or IQ Offset-QPSK (OQPSK) scheme.

Figure 5:
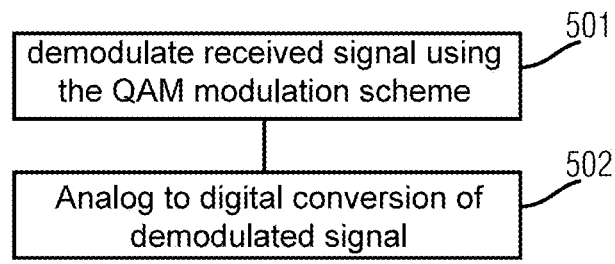
FIG. 5 is a flowchart for a reception processing method in the process of receiving an MR signal by using a receiver in the MR receiving coil device shown in FIG. 2 according to an embodiment of the present disclosure.

FIG. 5 is a flowchart for a reception processing method in the process of receiving an MR signal by using a receiver in the MR receiving coil device shown in FIG. 2 according to an embodiment of the present disclosure, and the specific steps are as follows:

Step 501: The receiving demodulator 1211 in each receiver 12, on receiving a signal from each IQ modulation transmitter 115 through the antenna 12111, demodulates the received signal by using a demodulation scheme corresponding to the QAM modulation scheme to restore it to baseband signals I and Q, and the baseband signals I and Q are respectively subjected to low-pass filtering and then output to the two connected ADCs 1212, respectively.

The receiving demodulator 1211 will receive signals from the IQ modulation transmitters 115 of all the transmitters 11; the receiving demodulator 1211 will sum up all the received signals and demodulate the signals to separate the baseband signals I and Q from the respective transmitter.

Step 502: The two ADCs 1212 in each receiver respectively convert their respective input baseband I signals or Q signals from analog signals into digital signals, and output the digital signals obtained after the conversion to the signal processor 13.

The signal processor 13 processes all the digital baseband signals I and Q input by the ADCs 1212 to obtain an MR image.

Figure 6:
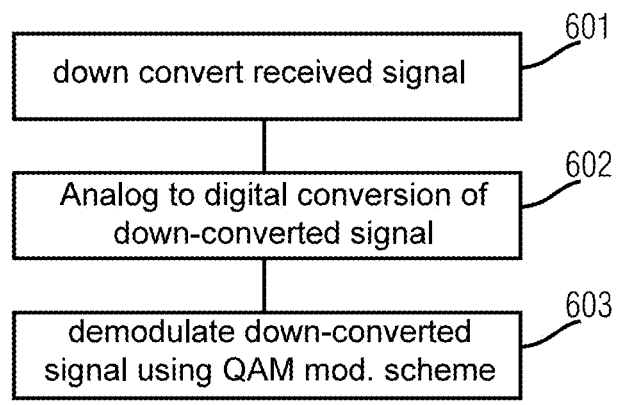
FIG. 6 is a flowchart for a reception processing method in the process of wirelessly receiving an MR signal by using a receiver in the MR receiving coil device shown in FIG. 3 according to an embodiment of the present disclosure.

FIG. 6 is a flowchart for a reception processing method in the process of wirelessly receiving an MR signal by using a receiver in the MR receiving coil device shown in FIG. 3 according to an embodiment of the present disclosure, and the specific steps are as follows:

Step 601: The down-conversion mixer 1221 in each receiver 12, on receiving a signal from each IQ modulation transmitter 115 through the antenna 12211, reduces the frequency of the signal to the frequency accepted by the ADC 1222 and then outputs the signal with lowered frequency to the ADC 1222.

Step 602: The ADC 1222 converts the input signal from an analog signal into an intermediate-frequency digital signal, and outputs the intermediate-frequency digital signal to an IQ digital demodulator 1223.

Step 603: The IQ digital demodulator 1223 adopts a demodulation scheme corresponding to the QAM modulation scheme to demodulate the baseband signals I and Q from the input intermediate-frequency digital signal, and outputs the digital baseband signals I and Q to the signal processor 13 for processing.

The signal processor 13 processes all the digital baseband signals I and Q input by the IQ digital demodulator 1223 to obtain an MR image.

Figure 7:
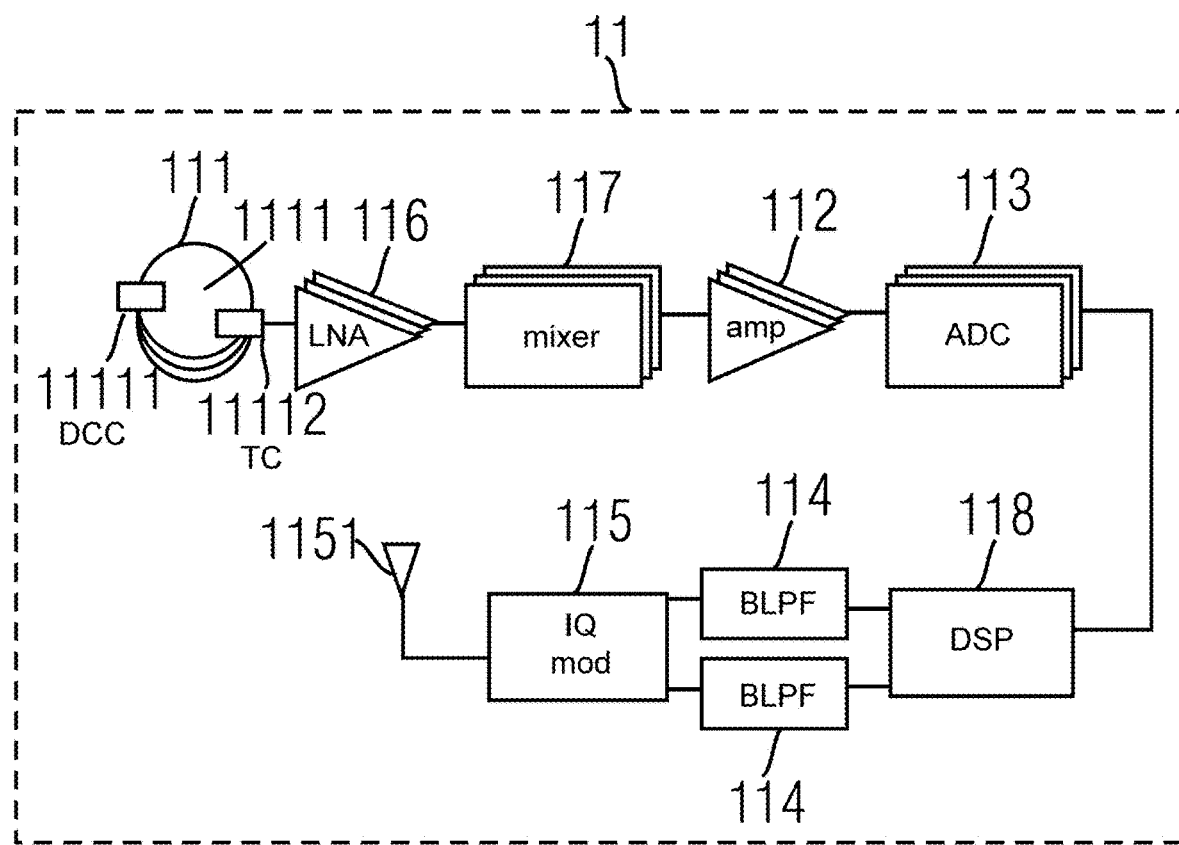
FIG. 7 is a schematic structural diagram for a transmitter in an MR wireless receiving coil device according to another embodiment of the present disclosure.

It should be noted that in practical applications, in order to improve the quality of MR signal transmission, the transmitter 11 shown in FIG. 1 may be improved as shown in FIG. 7, the improvement being specifically reflected in that:

1) a detuning control circuit 11111 and a matching tuning circuit 11112 are connected in series on each coil 1111 in the coil group 111;

the detuning circuit 11111 is configured to cause the coil 1111 to go into a detuned state.

Since the MR scanning process mainly comprises two steps: radio frequency signal transmission and reception, it is necessary to keep a receiving coil in a detuned state when in the transmitting state so that the receiving coil does not interfere with another component in the transmitting stage; this function is performed by the detuning control circuit 11111.

The tuning circuit 11112 is configured to match the impedance and resonance frequency of the coil 1111.

2) After each tuning circuit 11112, an amplifier in the low-noise amplifier group 116 and a mixer in the mixer group 117 are connected, and then each mixer in the mixer group 117 is respectively connected to an amplifier in the amplifier group 112, wherein the tuning circuit 11112 is connected to the corresponding low-noise amplifier in the low-noise amplifier group 116 in the transmitter 11 through a coaxial cable or a wire;

each low-noise amplifier in the low-noise amplifier group 116 is connected to the corresponding mixer in the mixer group 117 in the transmitter 11 through a coaxial cable or a wire; and each mixer in the mixer group 117 is connected to a corresponding amplifier in the amplifier group 112 in the transmitter 11 through a coaxial cable or a wire.

Each low-noise amplifier in the low-noise amplifier group 116 is configured to perform low-noise amplification on an MR signal input by the tuning circuit 11112 and then output the signal to the corresponding mixer in the mixer group 117;

each mixer in the mixer group 117 is configured to mix an MR signal output by the low-noise amplifier in the low-noise amplifier group 116, move the frequency of the MR signal to another preset frequency, and output the mixed MR signal to the corresponding amplifier in the amplifier group 112.

The objective of moving the frequency of the MR signal to another frequency is to facilitate the subsequent AD conversion and prevent self-oscillation caused by multi-stage amplification.

3) A digital signal processor 118 is connected between the ADC group 113 and the two baseband low-pass filters 114, or a digital signal processor 118 is built in the ADC group 113;

the digital signal processor 118 is configured to filter and mix a digital signal obtained by the ADC group 113 through AD conversion, move the frequency of the digital signal to a preset low frequency, lower the sampling rate of the digital signal, perform forward error correction on the digital signal by using convolutional code, and output the digital signal subjected to forward error correction through two channels to the two connected baseband low-pass filters 114, respectively.

In order to ensure the quality of AD conversion, after AD conversion, the frequency of the MR signal is moved to another frequency by the mixer group 117; therefore, the data volume of the MR signal is very large. After the AD conversion, in order to reduce the data volume, the MR signal is filtered and mixed first, the frequency of the MR signal is moved to a low frequency, and then the sampling rate is lowered, finally achieving the objective of reducing the data volume.

Forward error correction allows a decrease in the bit error rate of MR signal transmission and making of preparations for modulation. According to requirements on wireless coils, a convolutional code may be used for encoding of forward error correction, and, correspondingly, the receiving demodulator 1211 adopts a corresponding Viterbi decoding method for decoding; certainly, another error correction encoding and decoding method may also be used.

In addition, when the IQ modulation transmitter 115 adopts a high-order modulation scheme, for example, QAM 16, QAM 64, or QAM 256, two DACs need to be connected between the digital signal processor 118 and the two baseband low-pass filters 114, for converting the two digital signals output by the digital signal processor 118 into analog signals and then outputting them to the two baseband low-pass filters 114.

In an embodiment of the present disclosure, a QAM modulation scheme adopted by the IQ modulation transmitter 115 is, for example, QAM 4 (QPSK), QAM 16, QAM 64, or QAM 256.

As the modulation order increases, modulation becomes more complex. In order to reduce complexity, in an embodiment of the present disclosure, a QPSK or OQPSK modulation scheme is preferably adopted. Since QPSK or a similar simple modulation scheme is used, no DAC is needed, and the computational load of the corresponding digital signal processing will be reduced; thus, the volume and power consumption are reduced.

In an embodiment of the present disclosure, the number of coils contained in each coil group is mainly determined by available bandwidth, modulation scheme, bandwidth of MR signal, sampling rate and sampling accuracy of MR signal; the ratio of forward error correction, the roll-off bandwidth percentage of the baseband low-pass filters 114, etc. may also be considered.

For example, when a QPSK or OQPSK modulation scheme is adopted, if the maximum bandwidth of MR signal is 1 MHz, the minimum required sampling rate is 2 Msps, and the sampling precision is 20 bit, then the data volume of signals in each channel is 40 Mbit/s; if the forward error correction ratio is 8:10, then the data volume of each channel is 50 Mbit/s; the bandwidth of the 5.8 GHz ISM band is 150 Mbit/s; if a baseband low-pass filter 114 adopts a roll-off percentage of 20%, then the available bandwidth is 150/1.2=125 MHz, and the amount of data that may be modulated by QPSK modulation is 125×2=250 Mbit/s; then, 250 Mbit/s/50 Mbit/s=5 channels of signals may be transmitted on the 5.8 GHz ISM band. Considering the need for design redundancy, forming a coil group with 4 to 5 coils may finally be considered.

The number of transmitters 11 included in the MR receiving coil device 10, $N$,=the total data transmission rate to be achieved/the maximum data transmission rate of each transmitter 11. For example, assuming that the MR signal data rate is 125 Msps and the roll-off bandwidth percentage of the baseband low-pass filter 114 is 20%, then the maximum data transmission rate of each transmitter 11 is 250 Mbit/s; if a total data transmission rate of m Gbit/s is to be reached, the number of transmitters 11 needed, N, is: N=m Gbit/s/250 Mbit/s. For example, if a total data transmission rate of 1.5 Gbit/s is to be reached, the number of transmitters 11 needed, N, is: N=1.5 Gbit/s/250 Mbit/s=6.

In order to ensure accurate reconstruction of the MR signals of all the transmitters 11, the number of the receivers 12 must be equal to or greater than the number of the transmitters 11.

Compared with other frequency bands, the 5.8 GHz ISM band has the following advantages:

1. The 5.8 GHz ISM band supports data transmission over a short distance (0.5 m), and a unipole antenna can sustain antenna free-space attenuation. In contrast, in the 60 GHz band, the attenuation of a wireless coil is already too high.
2. When the wavelength of the 5.8 GHz ISM band is 5.2 cm, diffraction still effectively bypasses any obstacles. In contrast, in the 60 GHz band, almost linear transmission is needed. In the 5.8 GHz ISM band, the absorption rate of clothes and plastic covers is not as high as in the 60 GHz band, which is acceptable for an MRI wireless coil.
3. The bandwidth of the 5.8 GHz ISM band is 150 MHz, which can meet the bandwidth requirements on MRI wireless coils. In contrast, at a low frequency, for example, 2.4 GHz, the available bandwidth is too low according to requirements on radio frequency adjustment, which fails to meet the requirements on MRI wireless coils.

According to the preceding analysis, in an embodiment of the present disclosure, MR wireless local area coils preferentially use the 5.8 GHz ISM band.

In the above-described embodiment, an MR receiving coil device is designed such that it is composed of a plurality of transmitters and a plurality of receivers, each transmitter containing a coil group composed of one or more coils, the plurality of transmitters simultaneously receiving and transmitting MR signals, the plurality of receivers simultaneously receiving modulated MR signals; this allows an increase in the amount of magnetic resonance information transmitted per unit frequency band, realization of high-speed data transmission, and, by increasing the number of transmitters, flexible expansion of the number of receiving channels supported by the MR system;

in addition, a QPSK modulation scheme is adopted by a transmitter to modulate an MR signal to the 5.8 GHz frequency of the ISM band, which simplifies the coil design and reduces the complexity of manufacture and application of the MR receiving coil device.

It should be pointed out that, because an MR receiving coil device according to an embodiment of the present disclosure uses a plurality of transmitters, signals simultaneously transmitted by the IQ modulation transmitters in the plurality of transmitters interfere with each other, leading to a power loss or signal-to-noise ratio (SNR) loss.

In order to calculate power loss or SNR loss of an MR receiving coil device according to an embodiment of the present disclosure, an embodiment of the present disclosure provides a simulated MR reception system for simulating the actual operating process of an MR receiving coil device according to an embodiment of the present disclosure, thereby allowing the calculation of the power loss or SNR loss caused by the MR receiving coil device in actual operation.

In this simulated MR reception system, according to the biological mass of the human body, a rectangular cube made of a certain material is used to simulate a patient's body, wherein N transmitters 11 are located below the patient's body, and Q (Q≥N) receivers 12 are located above the patient's body. According to this system, the power loss or SNR loss caused by the MR receiving coil device in actual operation can be simulated and calculated. If the worst-case power loss or SNR loss caused by the MR receiving coil device is calculated at x dB, then the transmit power of the IQ modulation transmitter 115 in each transmitter 11 needs to be increased by x dB to achieve the same SNR or bit error rate performance as a single transmitting/receiving antenna.

Figure 8:
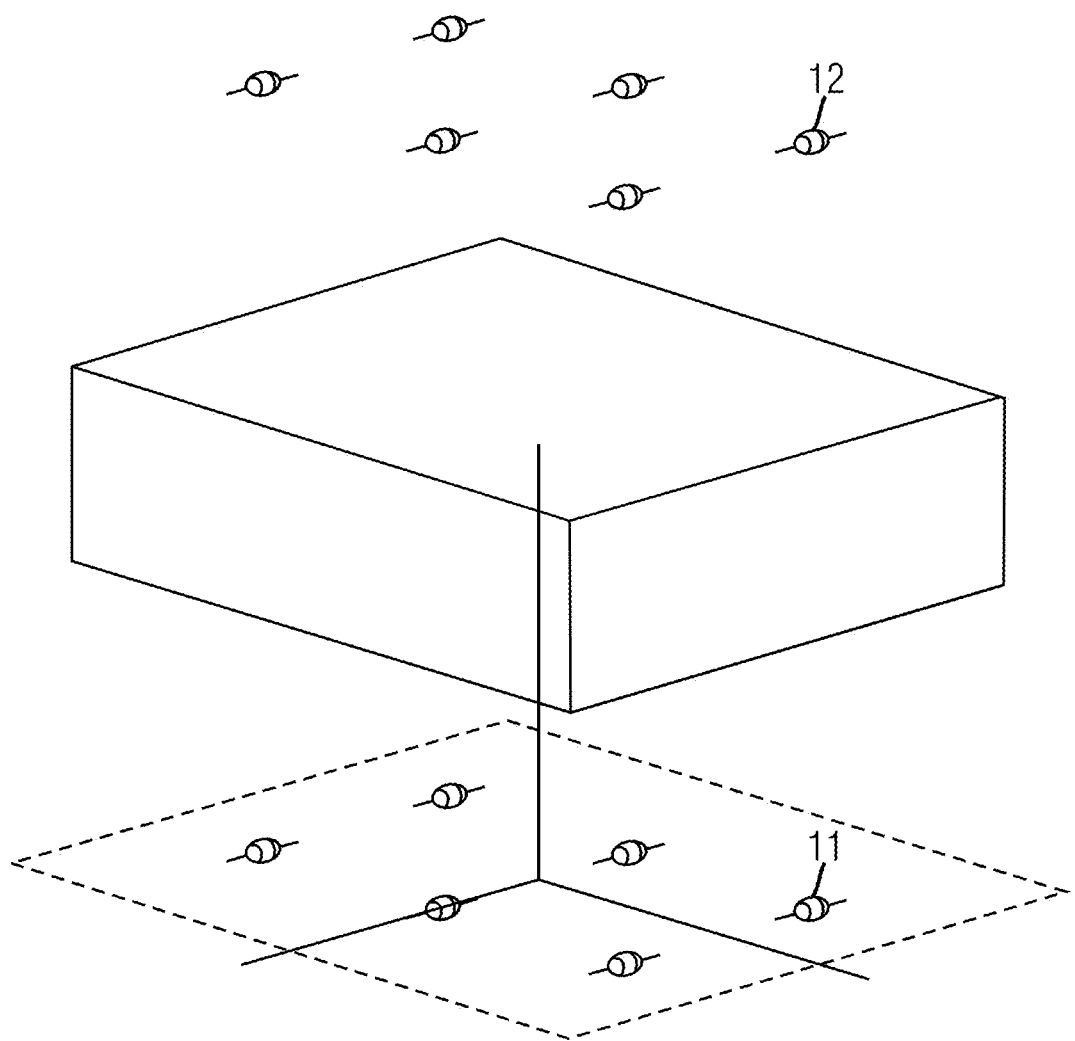
FIG. 8 is a schematic diagram for a simulation system of a 6×6 MR wireless receiving coil device according to an embodiment of the present disclosure.

FIG. 8 is a schematic diagram for a simulation system for a 6×6 MR receiving coil device, in which the number of transmitters 11 is 6 and the number of receivers 12 is also 6. Simulation of the 6×6 MR receiving coil device by the simulation system showed that in the worst case, the SNR loss of the MR receiving coil device is 8.2 dB. This means that, in the worst case, the transmit power of each IQ modulation transmitter 115 needs to be increased by about 8.2 dB to achieve the same SNR or bit error rate performance as a single transmitting/receiving antenna. Considering that 6 transmitters, instead of 1 transmitter, are needed, the total transmit power at 1.5 Gbit/s needs to be 8.2 dB+10×log 10(6)=16 dB higher than, which is 40 times, that at 250 Mbit/s.

Figure 9:
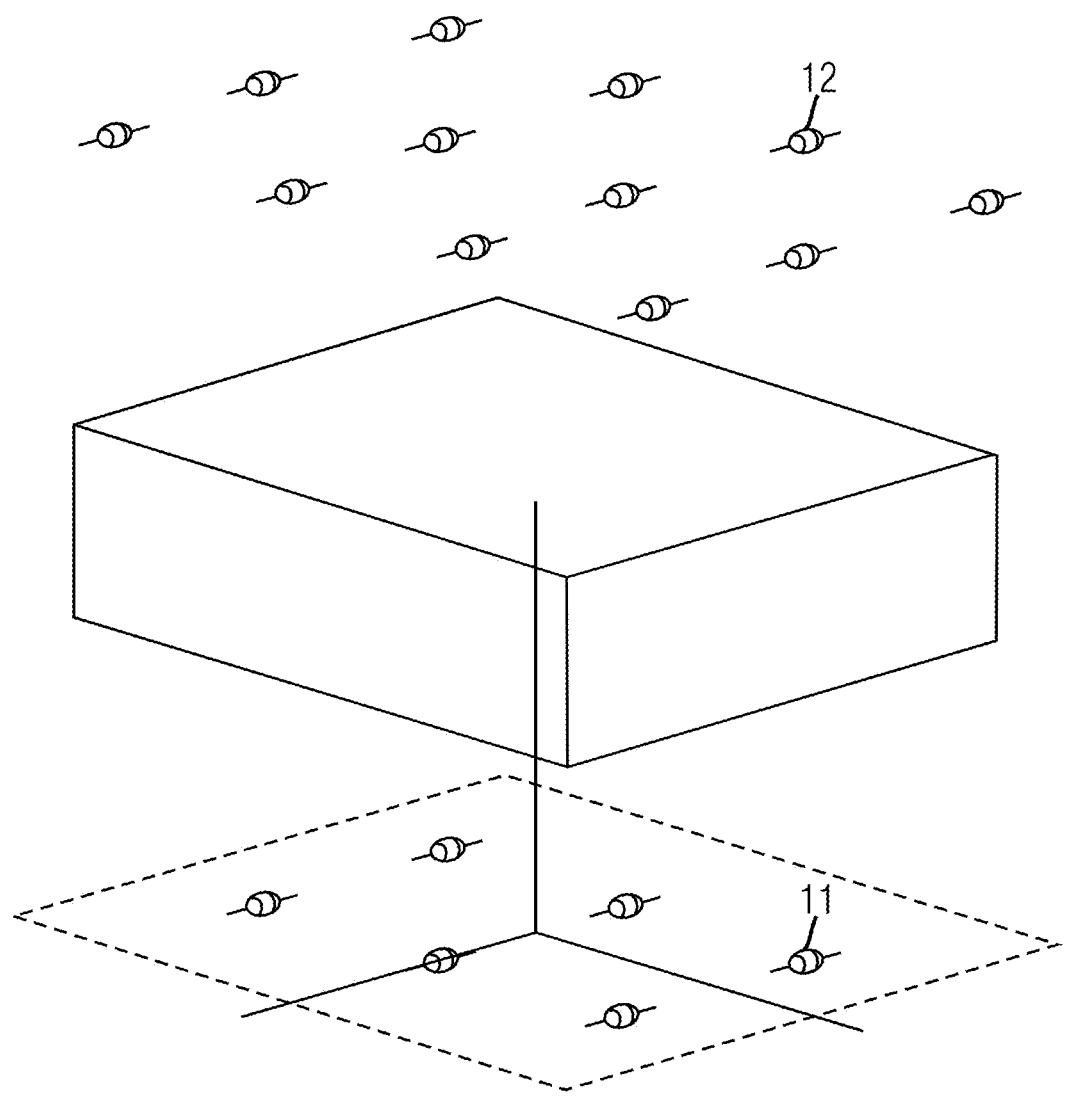
FIG. 9 is a schematic diagram for a simulation system of a 6×12 MR wireless receiving coil device according to an embodiment of the present disclosure.

In practical applications, more receivers 12 may be used to reduce the transmit power of the IQ modulation transmitter 115. FIG. 9 is a schematic diagram for a simulation system for a 6×12 MR receiving coil device, the MR receiving coil device using 6 transmitters and 12 receivers. After the number of receivers is increased, the transmit power required by the IQ modulation transmitter 115 may be greatly reduced. Compared with the 6×6 MR receiving coil device, according to the simulation results, the 6×12 MR receiving coil device can allow a reduction of the required transmit power by 12 dB.

One or more embodiments of the present disclosure have the following advantages:
1. An MR receiving coil device is designed such that it is composed of a plurality of transmitters and a plurality of receivers, each transmitter containing a coil group composed of one or more coils, the plurality of transmitters simultaneously receiving and transmitting MR signals, the plurality of receivers simultaneously receiving modulated MR signals; this allows an increase in the amount of magnetic resonance information transmitted per unit frequency band;
2. In the 5.8 GHz ISM band, a set of clothes, a plastic cover, or a patient's body is still penetrable, which is very important for the application of wireless coils. Therefore, an embodiment of the present disclosure preferably adopts the 5.8 GHz ISM band; at the same time, the use of a plurality of transmitters with the same transmitting frequency allows a reduction of the difficulty of manufacture and application;
3. A coil group in each transmitter comprises a plurality of coils, and the transmitters do not need to be connected to each other in the coil housing; this allows great simplification of the coil design and minimization of unnecessary side effects, such as common-mode current at MR frequency;
4. Each transmitter can operate independently without data aggregation or common time synchronization, and the corresponding number of transmitters may be selected according to the required number of MR receiving channels; in other words, by providing more MR receiving channels, it is easy to increase the maximum number of coils supported by the MR system;
5. The simplest modulation scheme is used. QPSK modulation, compared with the high-order QAM modulation scheme, does not require the use of a DAC or FPGA; this is very important for the realization of wireless coils, because space and power consumption play very important roles in wireless coils; in addition, the use of a simple modulation scheme allows a reduction of system performance requirements (such as phase stability or nonlinearity). Since QPSK, especially OQPSK, undergoes minor amplitude changes, a simple and effective transmitting amplifier can be used.

Figure 10:
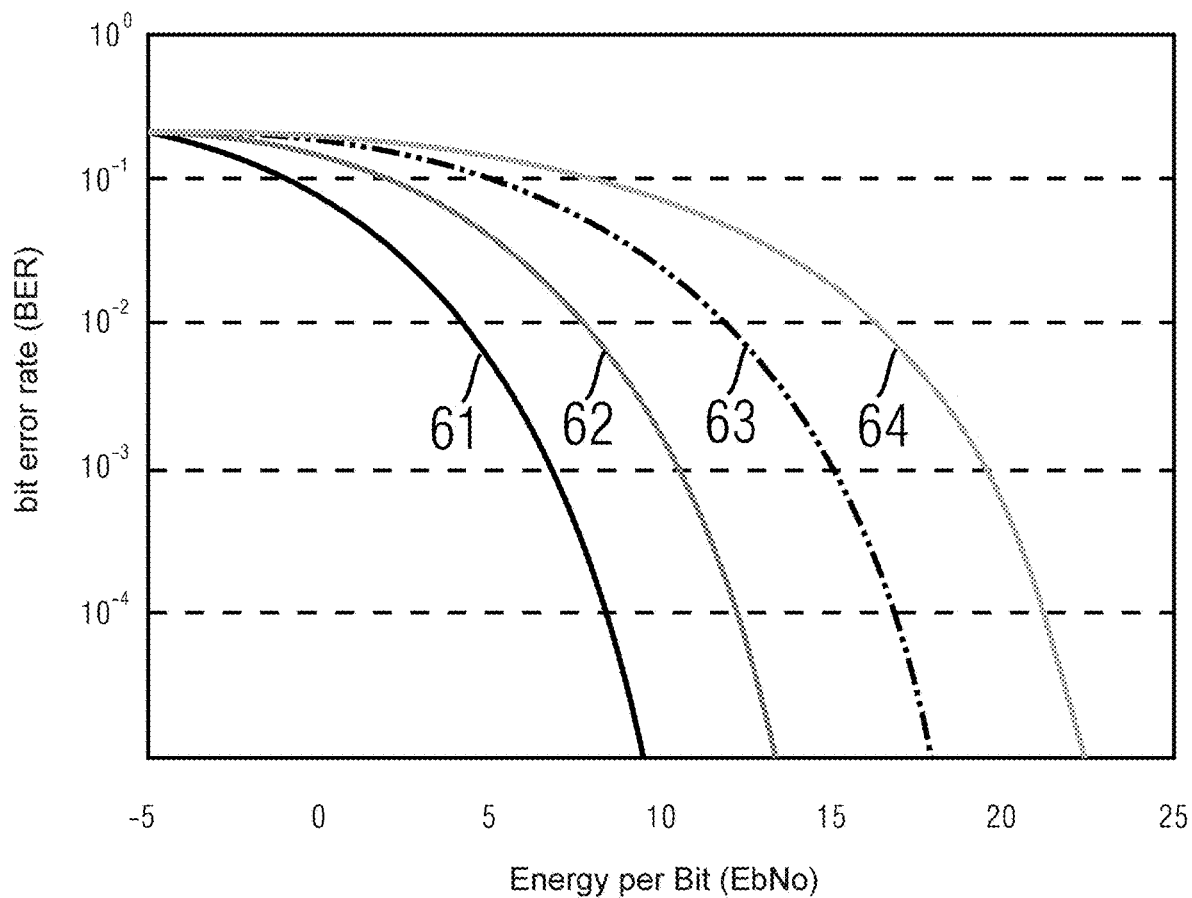
FIG. 10 is a schematic diagram for the energy per bit required by a magnetic resonance wireless coil adopting different modulation schemes, according to embodiments of the present disclosure.

FIG. 10 is a schematic diagram for the energy per bit required by a magnetic resonance wireless coil adopting different modulation schemes, where the abscissa indicates EbNo (energy per bit), the ordinate indicates the bit error rate (BER), curve 61 corresponds to QAM 4, namely, QPSK or OQPSK, curve 62 corresponds to QAM 16, curve 63 corresponds to QAM 64, and curve 64 corresponds to QAM 256; modulation by QPSK, that is, 4-QAM (2 bit per symbol) was increased to 256-QAM (8 bit per symbol, 1 Gbit/s), and the Hamming distance between adjacent symbols was reduced by 7 times. In order to maintain the BER, the transmit power needs to be increased by $(8-1)^2=49$ times or 17 dB, which is equivalent to an energy increase of 11 dB per bit. Regarding 4096-QAM, it provides 12 bit/symbol; to achieve the same throughput of 1.5 Gbit/s achieved by the 6×6 MR receiving coil device using QPSK modulation in an embodiment of the present disclosure, theoretically $(64-1)^2=3969$ times the power (36 dB) is needed, which is 100 times the power required of the 6×6 MR receiving coil device using QPSK modulation in an embodiment of the present disclosure.

For high-order QAM modulation, a wide linear dynamic range is required, and thus more battery power consumption is needed. On the other hand, all the four QPSK symbols have the same magnitude, and a change in output power is caused only by a bandwidth-limited symbol jump. It is well known that the half-symbol time offset between the I bit clock and Q bit clock (OQPSK modulation) can alleviate a symbol jump without affecting the bandwidth or data rate.
6. Compared with wireless coils using Wi-Fi standards 802.11ac and 802.11ax (5.2 GHz-5.8 GHz Wi-Fi using QAM 256-QAM 1024) or 802.11ad (using 60 GHz Wi-Fi), simple QPSK modulation does not require processing by a protocol and therefore may be easily implemented without FPGA or DSP support; and 7. OQPSK modulation and demodulation using analog 90-degree phase-shift I and Q channel sampling can also allow a reduction of the performance requirements on IQ modulation transmitters.

An embodiment of the present disclosure further provides an MR system that comprises the MR receiving coil device as described above.

While the present disclosure has been described and illustrated in detail above with reference to the drawings and preferred embodiments, the present disclosure is not limited to these disclosed embodiments, and more embodiments of the present disclosure may be obtained by combining the code auditing means in the different embodiments described above, as can be appreciated by those of ordinary skill in the art based on the above-mentioned embodiments; these embodiments also fall within the scope of protection of the present disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST

MR wireless receiving coil device
11 Transmitter
111 Coil group
1111 Coil
11111 Detuning control circuit
11112 Tuning circuit
112 Amplifier group
113 ADC group in transmitter
114 Baseband low-pass filter
115 IQ modulation transmitter
1151 Antenna of IQ modulation transmitter
116 Low-noise amplifier group
117 Mixer group
118 Digital signal processor
12 Receiver
1211 Receiving demodulator
12111 Antenna of receiving demodulator
1212 ADC in the receiver of an embodiment
1221 Down-conversion mixer
1222 ADC in the receiver of another embodiment
1223 IQ digital demodulator 13 Signal processor
401-405 Steps
501-502 Steps
601-603 Steps

The invention claimed is:
1. A magnetic resonance (MR) receiving coil device, located in a magnetic resonance system, the MR receiving coil device comprising:
a plurality of transmitters, each transmitter including: a coil group, an analog-to-digital converter (ADC) group, two baseband low-pass filters, and an IQ modulation transmitter, wherein:
each coil group contains one or more coils, the number of ADCs contained in each ADC group being equal to or smaller than the number of coils contained in each coil group, the coil group is connected to the ADC group, the ADC group is connected to the two baseband low-pass filters, the two baseband low-pass filters are connected to the IQ modulation transmitter, and the IQ modulation transmitter is provided with an antenna, the coil group in each transmitter, on receiving an MR signal, being configured to output the MR signal to the connected ADC group, the ADC group converts the input MR signal from an analog signal to a digital signal, and then outputs the signal through two channels to the two connected baseband low-pass filters, respectively; the two baseband low-pass filters perform low-pass filtering on the input digital signal to limit a frequency band of the signal to be within a bandwidth supported by a used frequency band, and output the two signals obtained after low-pass filtering as signals I and Q, respectively, to the IQ modulation transmitter; the IQ modulation transmitter, by a quadrature amplitude modulation (QAM) scheme, modulates the input signals I and Q to a frequency of the used frequency band and then transmits the modulated signal through the antenna.

2. The MR receiving coil device as claimed in claim 1, further comprising a plurality of receivers, a number of the receivers being equal to or greater than a number of the transmitters, wherein each receiver, on receiving a signal from each IQ modulation transmitter, is configured to:
demodulate the signal with a demodulation scheme corresponding to the QAM modulation scheme to restore the signal to baseband signals I and Q, convert the baseband signals I and Q from analog signals to digital signals, and output the converted digital signals to a signal processor for processing; or
lower the frequency of the signal, convert the signal from an analog signal to an intermediate-frequency digital signal, demodulate baseband signals I and Q from the intermediate-frequency digital signal, and output the digital baseband signals I and Q to the signal processor for processing.

3. The MR receiving coil device as claimed in claim 1, wherein:
the coil group in each transmitter is connected to the ADC group through an amplifier group,
the coil group in each transmitter, on receiving an MR signal, is configured to output the MR signal to the connected amplifier group, and
the amplifier group, after amplifying the input MR signal, is configured to output the amplified MR signal to the connected ADC group.

4. The MR receiving coil device as claimed in claim 3, wherein:
the coil is connected in series with a detuning control circuit and a tuning circuit;
a low-noise amplifier group and a mixer group are connected between a coil group and an amplifier group of the transmitter;
the tuning circuit of each coil in the coil group is respectively connected to a low-noise amplifier in the low-noise amplifier group, each low-noise amplifier in the low-noise amplifier group being respectively connected to a mixer in the mixer group, and each mixer in the mixer group being respectively connected to an amplifier in the amplifier group;
the low-noise amplifier group is configured to perform low-noise amplification on an MR signal output by the coil group, and output the MR signal subjected to low-noise amplification to the mixer group; and
the mixer group is configured to mix the MR signal output by the low-noise amplifier group, move a frequency of the MR signal to another preset frequency, and output the mixed MR signal to the amplifier group.

5. The MR receiving coil device as claimed in claim 4, wherein:
the tuning circuit is connected to the corresponding low-noise amplifier in the low-noise amplifier group in the transmitter through a coaxial cable or wire;
the low-noise amplifier group is connected to the mixer group in the transmitter through a coaxial cable or a wire; and
the mixer group is connected to the amplifier group in the transmitter through a coaxial cable or a wire.

6. The MR receiving coil device as claimed in claim 1, wherein:
the transmitter further comprises: a digital signal processor connected between an ADC group and the two baseband low-pass filters or built in an ADC group; and
the digital signal processor is configured to filter and mix a digital signal obtained by the ADC group through analog-to-digital (AD) conversion, move a frequency of the digital signal to a preset low frequency, lower a sampling rate of the digital signal, perform forward error correction on the digital signal by using convolutional code, and output the digital signal subjected to forward error correction through two channels to the two connected baseband low-pass filters, respectively.

7. The MR receiving coil device as claimed in claim 6, wherein:
the IQ modulation transmitter so configured to adopt quadrature amplitude modulation (QAM) 16, QAM 64, or QAM 256 to modulate a center frequency of an input signal to a frequency of the used frequency band; and
the digital signal processor is connected to two baseband low-pass filters through two digital-to-analog converters (DACs), the two DACs being configured to respectively convert two digital signals output by the digital signal processor into analog signals and output the analog signals to the two baseband low-pass filters.

8. The MR receiving coil device as claimed in claim 1, wherein:
the coil group in each transmitter is connected to the ADC group in the transmitter through a coaxial cable or wire;
the ADC group in each transmitter is connected to the two baseband low-pass filters in the transmitter through a coaxial cable or a wire; and
the two baseband low-pass filters in each transmitter are connected to the IQ modulation transmitter in the transmitter through a coaxial cable or a wire.

9. The MR receiving coil device as claimed in claim 2, wherein:
- each receiver comprises: a receiving demodulator and two ADCs, wherein the receiving demodulator is connected to the two ADCs, and the receiving demodulator is provided with an antenna;
- the receiving demodulator in each receiver, on receiving a signal from each IQ modulation transmitter through the antenna, is configured to: demodulate the signal by a demodulation scheme corresponding to the QAM modulation scheme to restore the signal to baseband signals I and Q, after low-pass filtering is performed on the baseband signals I and Q, output the baseband signals I and Q to the two connected ADCs, respectively;
- the two ADCs are configured to convert the input baseband signal I or signal Q from an analog signal to a digital signal, and output the digital signal obtained after the conversion to the signal processor for processing, alternatively;
- each receiver comprises: a receiving demodulator, two low-pass filters, and two ADCs, wherein the receiving demodulator is connected to the two low-pass filters, each low-pass filter being connected to one ADC, respectively, and the receiving demodulator is provided with an antenna;
- the receiving demodulator in each receiver, on receiving a signal from each IQ modulation transmitter through the antenna, is configured to demodulate the signal by using a demodulation scheme corresponding to the QAM modulation scheme to restore the signal to baseband signals I and Q, and output the baseband signals I and Q respectively to a low-pass filter for low-pass filtering;
- the two low-pass filters are configured to output the baseband signals I and Q subjected to low-pass filtering to their respective connected ADCs; and
- the two ADCs are configured to convert the input baseband signal I or signal Q from an analog signal to a digital signal, and output the digital signal obtained after the conversion to the signal processor for processing.

10. The MR receiving coil device as claimed in claim 9, wherein:
- the receiving demodulator in each receiver is connected to the two ADCs in the receiver through a coaxial cable or a wire; or
- the receiving demodulator in each receiver is connected to the two low-pass filters in the receiver through a coaxial cable or wire, each low-pass filter being respectively connected to an ADC through a coaxial cable or wire.

11. The MR receiving coil device as claimed in claim 2, wherein:
- each receiver comprises: a down-conversion mixer, an ADC, and an IQ digital demodulator, wherein the down-conversion mixer is connected to the ADC, the ADC is connected to the IQ digital demodulator, and the down-conversion mixer is provided with an antenna;
- the down-conversion mixer in each receiver, on receiving a signal from each IQ modulation transmitter through the antenna, is configured to reduce a frequency of the signal to a frequency accepted by the ADC and output the signal with lowered frequency to the ADC;
- the ADC is configured to convert an input signal from an analog signal to an intermediate-frequency digital signal, and output the intermediate-frequency digital signal to the IQ digital demodulator; and
- the IQ digital demodulator, by using a demodulation scheme corresponding to the QAM modulation scheme, is configured to demodulate baseband signals I and Q from the input intermediate-frequency digital signal, and output the digital baseband signals I and Q to the signal processor for processing.

12. The MR receiving coil device as claimed in claim 11, wherein the down-conversion mixer is connected to an ADC in the receiver through a coaxial cable or a wire, the ADC, and the IQ digital demodulator connected to the receiver through a coaxial cable or a wire.

13. The MR receiving coil device as claimed in claim 1, wherein a maximum number of coils included in each coil group is determined by available bandwidth, modulation scheme, and a bandwidth, a sampling rate, and a sampling accuracy of MR signal.

14. A method for receiving a magnetic resonance (MR) signal using an MR receiving coil device, the method comprising:
- receiving, with a coil group in a transmitter, an MR signal and outputting the MR signal to a connected analog-to-digital converter (ADC) group;
- converting, with the ADC group, the input MR signal from an analog signal to a digital signal, and outputting the digital signal through two channels to two connected baseband low-pass filters, respectively;
- performing, with the two baseband low-pass filters respectively, low-pass filtering on the input digital signal, limiting a frequency band of the digital signal to be within a bandwidth supported by a used frequency band, and outputting signals obtained after the low-pass filtering as signals I and Q, respectively, to an IQ modulation transmitter; and
- adopting, with the IQ modulation transmitter, a quadrature amplitude modulation (QAM) scheme to modulate the input signals I and Q to the frequency of the used frequency band, and transmitting the modulated signal through an antenna.

15. The method as claimed in claim 14, wherein a receiver, on receiving a signal from each IQ modulation transmitter, demodulates the signal by using a demodulation scheme corresponding to the QAM modulation scheme to restore the signals to baseband signals I and Q, performs low-pass filtering on the baseband signals I and Q, converts the baseband signals I and Q from analog signals to digital signals, and outputs the converted digital signals to a signal processor for processing, or, on receiving a signal from each IQ modulation transmitter, lowers a frequency of the signal, converts the signal from an analog signal to an intermediate-frequency digital signal, demodulates baseband signals I and Q from the intermediate-frequency digital signal, and then outputs the digital baseband signals I and Q to the signal processor for processing.

16. The method as claimed in claim 14, wherein the modulating, with the IQ modulation transmitter, the input signals I and Q to the frequency of the used frequency band by using a QAM scheme comprises:
- adopting, with the IQ modulation transmitter, a quadrature phase shift keying (QPSK) or offset quadrature phase shift keying (OQPSK) scheme to modulate the input signals I and Q to the frequency of the used frequency band.

17. The method as claimed in claim 14, wherein:
- after converting, with the ADC group, the input MR signal from an analog signal to a digital signal, the method further comprises: filtering and mixing the digital signal, moving the frequency of the digital signal to a preset low frequency, lowering the sampling rate of the digital signal, performing forward error correction on the digital signal by using convolutional code, converting the digital signal subjected to forward error correction into analog signals through two channels, and outputting the two analog signals to the two baseband low-pass filters, respectively;

the adopting, with the IQ modulation transmitter, a QAM scheme to modulate an input signal to the frequency of the used frequency band comprises: adopting, with the IQ modulation transmitter, QAM 16, QAM 64, or QAM 256 to modulate an input signal to the frequency of the used frequency band.

18. The method as claimed in claim 14, wherein limiting the frequency band of the digital signal to be within the bandwidth supported by the used frequency band comprises:

limiting the frequency band of the digital signal to be within the bandwidth supported by the Industrial Scientific Medical (ISM) band; and said adopting, with the IQ modulation transmitter, a quadrature amplitude modulation (QAM) scheme to modulate the input signals I and Q to the frequency of the used frequency band comprises:

adopting, with the IQ modulation transmitter, a QAM scheme to modulate the input signals I and Q to the 5.8 GHz frequency of the ISM band.

19. A non-transitory computer-readable storage medium with an executable program stored thereon, that when executed, instructs a processor to perform the method of claim 14.

20. A magnetic resonance (MR) system comprising the MR receiving coil device as claimed in claim 1.

* * * * *